(12) United States Patent
Yim et al.

(10) Patent No.: US 8,569,773 B2
(45) Date of Patent: Oct. 29, 2013

(54) ORGANIC LIGHT EMITTING DISPLAY APPARATUS

(75) Inventors: Sang-Hoon Yim, Yongin (KR); Jin-Koo Chung, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 158 days.

(21) Appl. No.: 13/137,976

(22) Filed: Sep. 22, 2011

(65) Prior Publication Data

US 2012/0267643 A1 Oct. 25, 2012

(30) Foreign Application Priority Data

Apr. 25, 2011 (KR) ........................ 10-2011-0038439

(51) Int. Cl.
*H01L 21/00* (2006.01)
(52) U.S. Cl.
USPC .................................... 257/88; 257/E33.001
(58) Field of Classification Search
USPC ........................................... 257/88, E33.001
See application file for complete search history.

(56) References Cited

U.S. PATENT DOCUMENTS

2010/0098323 A1    4/2010    Agrawal et al.

FOREIGN PATENT DOCUMENTS

| KR | 10 2003-0038883 A | 5/2003 |
|----|-------------------|--------|
| KR | 20 2008-0003681 U | 9/2008 |

*Primary Examiner* — Anthony Ho
(74) *Attorney, Agent, or Firm* — Lee & Morse, P.C.

(57) ABSTRACT

Embodiments relate to an organic light-emitting display device, comprising a first substrate defined by a plurality of pixels each including a pixel area and a transmittance area adjacent to the pixel area, the pixel area emitting light in a first direction and the transmittance area transmitting external light, and the first substrate including a pair of optical pattern units for transmitting or blocking the external light for each transmittance area according to coded patterns corresponding to the plurality of pixels, a second substrate facing the first substrate and encapsulating the plurality of pixels on the first substrate, and a pair of sensor units corresponding to the pair of optical pattern units, the pair of sensor units being arranged in a second direction that is opposite to the first direction in which the light is emitted, the pair of sensor units receiving the external light passing through the pair of optical pattern units.

18 Claims, 9 Drawing Sheets

ORGANIC LIGHT EMITTING DISPLAY APPARATUS

CROSS-REFERENCE TO RELATED PATENT APPLICATION

This application claims the benefit of Korean Patent Application No. 10-2011-0038439, filed on Apr. 25, 2011, in the Korean Intellectual Property Office, the disclosure of which is incorporated herein in its entirety by reference.

BACKGROUND

1. Field

Embodiments relate to an organic light emitting display apparatus. More particularly, embodiments relate to an organic light emitting display apparatus for implementing interactive media.

2. Description of the Related Art

Interactive media is media in which a user and a mechanical device interact with each other. In interactive media, the user and the mechanical device interact with each other according to specific roles. For example, the display device in a display mode may provide an image to a user, and when the user makes a gesture in capture mode, the display device captures and recognizes the gesture. Then, the display device realizes a function corresponding to the gesture.

SUMMARY

According to an embodiment, there may be an organic light-emitting display device including: a first substrate defined by a plurality of pixels each including a pixel area and a transmittance area adjacent to the pixel area, the pixel area emitting light in a first direction and the transmittance area transmitting external light, and the first substrate including a pair of optical pattern units for transmitting or blocking the external light for each transmittance area according to coded patterns corresponding to the plurality of pixels; a second substrate facing the first substrate and encapsulating the plurality of pixels on the first substrate; and a pair of sensor units corresponding to the pair of optical pattern units, the pair of sensor units being arranged in a second direction that is opposite to the first direction in which the light is emitted, the pair of sensor units receiving the external light passing through the pair of optical pattern units.

The pair of optical pattern units may be formed in a center of the first substrate.

The pair of optical pattern units may be spaced apart from each other by a gap between a human's left eye and the human's right eye.

A virtual first axis that passes through a center of the pair of optical pattern units may be identical to a virtual second axis that passes through a center of the pair of sensor units corresponding to the pair of optical pattern units.

The pair of sensor units may be a charge coupled device (CCD) sensor or a complementary metal semiconductor (CMOS) sensor.

The organic light-emitting display device may further include: a pixel circuit unit on the first substrate, including one or more thin film transistors (TFTs), and positioned in the pixel area; a insulating layer covering the pixel area including the pixel circuit unit and the transmittance area; a first electrode on the insulating layer so as to be electrically connected to the pixel circuit unit, the first electrode being positioned in the pixel area and being adjacent to the pixel circuit unit so as not to overlap with the pixel circuit unit, and including a transparent conductive material; a second electrode capable of reflecting light so as to emit light toward the first electrode, the second electrode facing the first electrode and being positioned in the pixel area; and an organic layer between the first electrode and the second electrode and including an emission layer (EML).

The second electrode may include at least one metal of Ag, Mg, Al, Pt, Pd, Au, Ni, Nd, Ir, Cr, Li, Ca, Mo, and alloys thereof.

The pair of optical pattern units may include: a transmittance pattern through which the external light transmits; and a light-blocking pattern blocking the external light, wherein the light-blocking pattern is implemented when the second electrode capable of reflecting light is also formed in the transmittance area.

The pair of sensor units may be on side portions of the second substrate and receives the external light passing through the transmittance pattern of the optical pattern array.

The organic light-emitting display device may further include: a case formed in outside of the second substrate and protecting the second substrate, wherein the pair of sensor units is formed in the case and receives the external light passing through the transmittance pattern of the optical pattern array.

The organic light-emitting display device may further include: an occluder between the case and the second substrate, the occluder surrounds boundaries of the pair of sensor units.

The organic light-emitting display device may further include: a pixel circuit unit on the first substrate, including one or more TFTs, and positioned in the pixel area; a insulating layer covering the pixel area including the pixel circuit unit and the transmittance area; a first electrode on the insulating layer so as to be electrically connected to the pixel circuit unit, the first electrode being positioned in the pixel area and overlapping with the pixel circuit unit so as to cover the pixel circuit unit, the first electrode including a reflective layer that is capable of reflecting light, and including a conductive material; a second electrode capable of transmitting light so as to emit light in an opposite direction to a direction in which the first electrode reflects light, the second electrode facing the first electrode; and an organic layer between the first electrode and the second electrode and including an EML.

The pair of optical pattern units may include: a transmittance pattern through which the external light transmits; and a light-blocking pattern blocking the external light, wherein the light-blocking pattern is implemented when a light-blocking layer capable of blocking light is on the insulating layer formed in the transmittance area.

The light-blocking layer may include at least one metal of Ag, Mg, Al, Pt, Pd, Au, Ni, Nd, Ir, Cr, Li, Ca, Mo, and alloys thereof or may include a black matrix material.

The pair of sensor units may be on side portions of the first substrate and receives the external light passing through the transmittance pattern of the optical pattern array.

The organic light-emitting display device may further include: a case formed outside of the first substrate and protecting the first substrate, wherein the pair of sensor unit is formed in the case and receives the external light passing through the transmittance pattern of the optical pattern array.

The organic light-emitting display device may further include: an occluder between the case and the first substrate, the occluder surrounds boundaries of the pair of sensor units.

According to another embodiment, there may be an organic light-emitting display device including: a first substrate defined by a plurality of pixels each including a pixel area and a transmittance area adjacent to the pixel area, the pixel area emitting light in a first direction and the transmittance area transmitting external light; a second substrate facing the first substrate and encapsulating the plurality of pixels on the first substrate and the second substrate including a pair of optical pattern units for transmitting or blocking the external light for each transmittance area according to coded patterns corresponding to the plurality of pixels; and a pair of sensor units corresponding to the pair of optical pattern units, the pair of sensor units being arranged in a second direction that is opposite to the first direction in which the light is emitted, the pair of sensor units receiving the external light passing through the pair of optical pattern units.

The pair of optical pattern units may be formed in the center of the second substrate.

The pair of optical pattern units may be spaced apart from each other by a gap between a human's left eye and the human's right eye.

A virtual first axis that passes through a center of the pair of optical pattern units may be identical to a virtual second axis that passes through a center of the pair of sensor units corresponding to the pair of optical pattern units.

The pair of sensor units may be a CCD sensor or a CMOS sensor.

The organic light-emitting display device may further include: a pixel circuit unit on the first substrate, including one or more thin film transistors (TFTs), and positioned in the pixel area; a insulating layer covering the pixel area including the pixel circuit unit and the transmittance area; a first electrode on the insulating layer so as to be electrically connected to the pixel circuit unit, the first electrode being positioned in the pixel area and being adjacent to the pixel circuit unit so as not to overlap with the pixel circuit unit, and including a transparent conductive material; a second electrode capable of reflecting light so as to emit light toward the first electrode, the second electrode facing the first electrode and being positioned in the pixel area; and an organic layer between the first electrode and the second electrode and including an emission layer (EML).

The pair of optical pattern units may include: a transmittance pattern through which the external light transmits; and a light-blocking pattern blocking the external light, wherein the light-blocking pattern is implemented when a light-blocking layer is formed on the second substrate corresponding to the transmittance area.

The light-blocking layer may include at least one metal of Ag, Mg, Al, Pt, Pd, Au, Ni, Nd, Ir, Cr, Li, Ca, Mo, and alloys thereof or may include a black matrix material.

The air of sensor units may be on side portions of the second substrate and receives the external light passing through the transmittance pattern of the optical pattern array.

The organic light-emitting display device may further include: a case formed outside of the second substrate and protecting the second substrate, wherein the pair of sensor units is formed in the case and receives the external light passing through the transmittance pattern of the optical pattern array.

The organic light-emitting display device may further include: an occluder between the case and the second substrate, the occluder surrounds boundaries of the pair of sensor units.

BRIEF DESCRIPTION OF THE DRAWINGS

The above and other features will become more apparent by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein.

While such terms as "first," "second," etc., may be used to describe various components, such components must not be limited to the above terms. The above terms are used only to distinguish one component from another.

The terms used in the present specification are merely used to describe particular embodiments, and are not intended to limit present embodiments. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Figure 1:
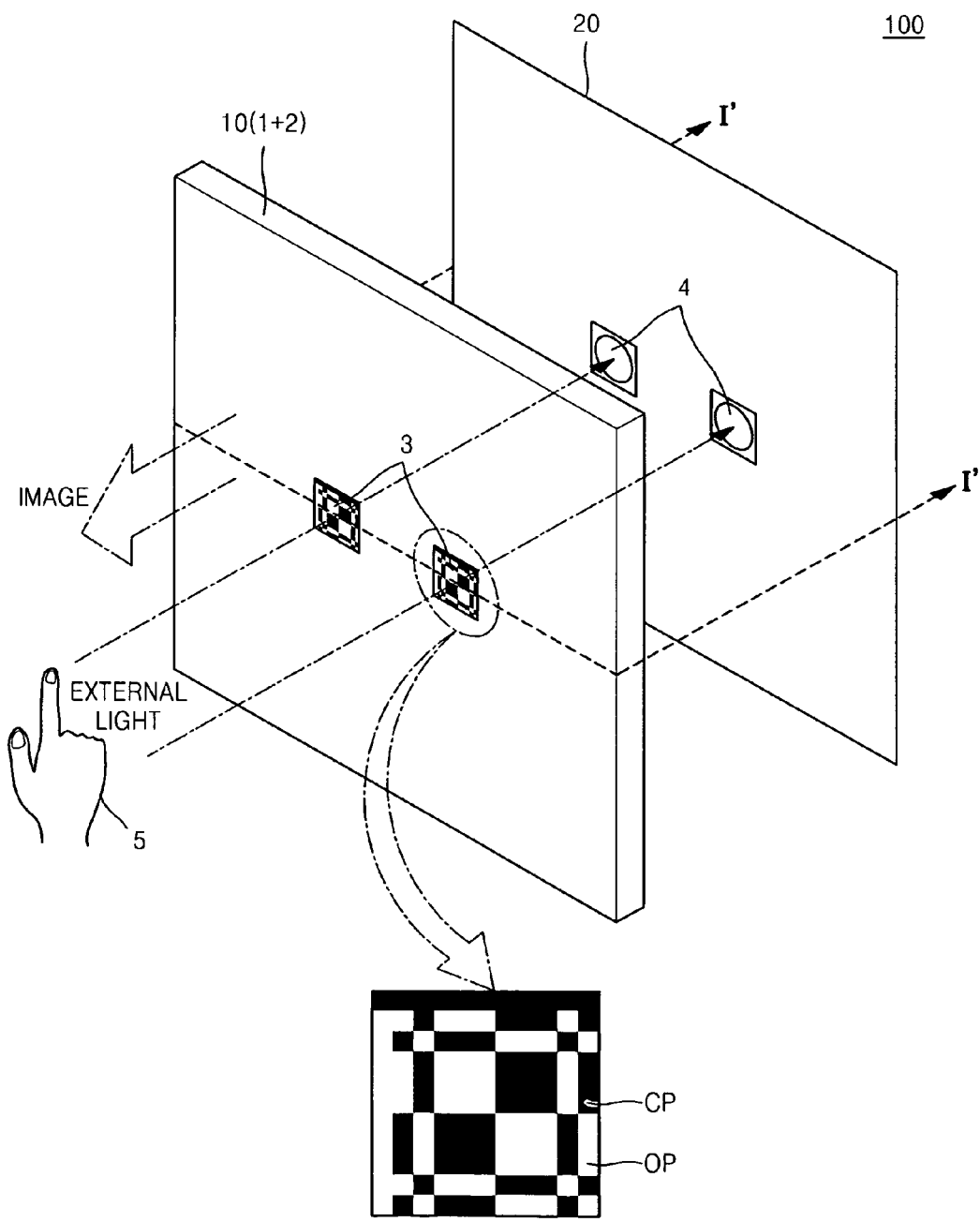
FIG. 1 is a schematic perspective view of an organic light emitting display apparatus according to an embodiment.

FIG. 1 is a schematic perspective view of an organic light emitting display apparatus 100 according to an embodiment.

Referring to FIG. 1, the organic light emitting display apparatus 100 includes a panel 10 including a first substrate 1 in which a pixel unit (11 of FIG. 2) is formed and a second substrate 2 that encapsulates the first substrate 1. The pixel unit (11 of FIG. 2) includes pixels each including a pixel area PA in which an image is formed in a first direction and a transmittance area TA in which external light is transmitted.

Meanwhile, according to the present embodiment, each pixel may include R, G, and B sub pixels each including the pixel area PA and the transmittance area TA. The transmittance areas TA of the adjacent R, G, and B sub pixels are connected to each other. Thus, pixels including the R, G, and B sub pixels share the transmittance area TA. An area of the transmittance area TA in which external light is transmitted broadens, thereby increasing transmittance of the organic light emitting display apparatus 100. Two sensor units 4 of the organic light emitting display apparatus 100 that are disposed opposite to the first direction in which the image is formed receive the external light through the first substrate 1 and the second substrate 2. The sensor units 4 may be an imaging device that receives light and capture the image. For example, the sensor units 4 may be a charge coupled device (CCD) sensor or a complementary metal semiconductor (CMOS) sensor.

A user can see the image formed in the organic light emitting display apparatus 100 in the first direction. If the user poses a gesture 5, the sensor units 4 can capture the user's gesture 5 projected through the panel 10 of the sensor units 4.

Meanwhile, the sensor units 4 can capture the user's gesture 5 by using optical pattern units 3 having coded patterns, analyze captured screens by using software, and extract 3D information on the analyzed screens. The optical pattern units 3 may be formed in the pixel unit (11 of FIG. 2) on the first substrate 1, and may be directly formed in the second substrate 2.

Figure 2:
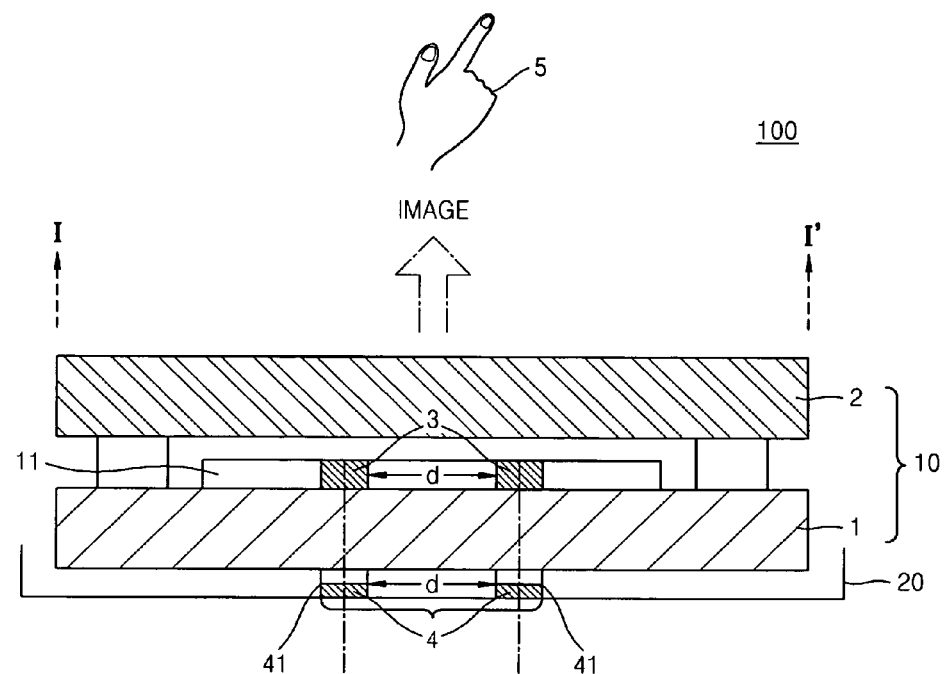
FIG. 2 is a cross-sectional view of the organic light emitting display apparatus of FIG. 1 taken along a line I-I' according to an embodiment.

FIG. 2 is a cross-sectional view of the organic light emitting display apparatus 100 taken along a line I-I' of FIG. 1 according to an embodiment.

Referring to FIG. 2, the organic light emitting display apparatus 100 is a top surface type organic light emitting display apparatus that forms an image in a direction of the second substrate 2. Thus, the sensor units 4 are formed outside of the first substrate 1.

Meanwhile, the organic light emitting display apparatus 100 may further include a case 20 that is formed in outside of the first substrate 1 and protects the first substrate 1. A circuit board may be disposed in the case 20. The sensor units 4 may be disposed in the case 20 when the case 20 is included in the organic light emitting display apparatus 100. According to the present embodiment, the sensor units 4 are disposed in the case 20. Thus, the organic light emitting display apparatus 100 can be manufactured with a minimum thickness.

Meanwhile, an occluder 41 may be further disposed between the case 20 and the first substrate 1. The occluder 41 is formed to surround boundaries of the sensor units 4. A hole (not shown) that functions as an air blowing hole may be formed in the case 20 to dissipate heat generated in the panel 10. However, external light is incident through the hole (not shown), which causes noise to occur in the sensor units 4. In this case, when the occluder 41 is formed to surround boundaries of the sensor units 4, the external light incident through the hole can be shaded, thereby preventing noise from occurring in the sensor units 4.

The panel 10 includes the pixel unit 11 as described above. The pixel unit 11 is formed on the first substrate 1, is partitioned as pixels each including the pixel area PA and the transmittance area TA, and includes two optical pattern units 3 corresponding to the pixels. The two sensor units 4 are disposed to correspond to the two optical pattern units 3. In this regard, a virtual first axis that passes through the center of the optical pattern units 3 is identical to a virtual second axis that passes through the center of the sensor units 4 corresponding to the optical pattern units 3. Thus, a small amount of information is lost through the optical pattern units 3 and the sensor units 4 when the user's gesture 5 is captured.

The optical pattern units 3 are formed in the center of the first substrate 1 so that the sensor units 4 are formed to correspond to the center of the first substrate 1, thereby reducing a dead zone generated when a conventional sensor or camera is disposed outside the panel 10.

Meanwhile, the two optical pattern units 3 are spaced apart from each other by a gap between a human's left and right eyes so that the two sensor units 4 are spaced apart from each other by the gap between the human's left and right eyes. According to the present embodiment, the user's gesture 5 is captured from the two sensor units 4 spaced by the gap between the human's left and right eyes, thereby obtaining 3D information.

For example, if a subject to be captured is disposed far away from the sensor units 4 and is disposed closer to the sensor units 4, locations of external light on surfaces of the left and right sensor units 4 through the left and right optical pattern units 3 differ. Thus, the left and right sensor units 4 calculate a distance between the subject and the sensor units 4 according to a difference in the locations of external light incident in the sensor units 4. The distance between the subject and the sensor units 4 spaced by the gap between the human's left and right eyes can be calculated in various ways. The process of calculating the distance between the subject and the sensor units 4 can be performed in a signal processing unit that is not shown by using software.

Referring to FIGS. 1 and 2, the optical pattern units 3 form coded patterns by occluding or not occluding a predetermined part of the transmittance area TA. A light-blocking pattern CP is a pattern to occlude the predetermined transmittance area TA. A transmittance pattern OP is a pattern not to occlude the predetermined transmittance area TA.

According to the present embodiment, the light-blocking pattern CP and the transmittance pattern OP are implemented by directly placing shading films 31 and 33 in the transparent organic light emitting display apparatus 100. Thus, no optical mask is used, thereby implementing a large-scale and slim display apparatus.

The transmittance pattern OP exhibits a similar effect to that of a pinhole lens. Light is wholly concentrated at one point of the pinhole lens and thus causing no aberration. A thick lens is usually necessary to remove an aberration, whereas the transmittance pattern OP causes no aberration. Thus, the thickness of the transmittance pattern OP is not limited.

The sensor units 4 receive incident light by using the optical pattern units 3 as optical masks. For example, the sensor units 3 corresponding to the transmittance pattern OP may receive light and capture an image, whereas no light is incident in the sensor units 4 corresponding to the light-blocking pattern CP. Thus, the sensor units 4 can not capture an image or obtain a black image.

The sensor unit 4 captures images according to the transmittance pattern OP and the light-blocking pattern CP. The signal processing unit that is not shown processes a captured image and obtains 3D information as described above.

FIGS. 3A through 3D illustrate various optical pattern units 3 according to an embodiment.

Figures 3A, 3B, 3C, 3D:
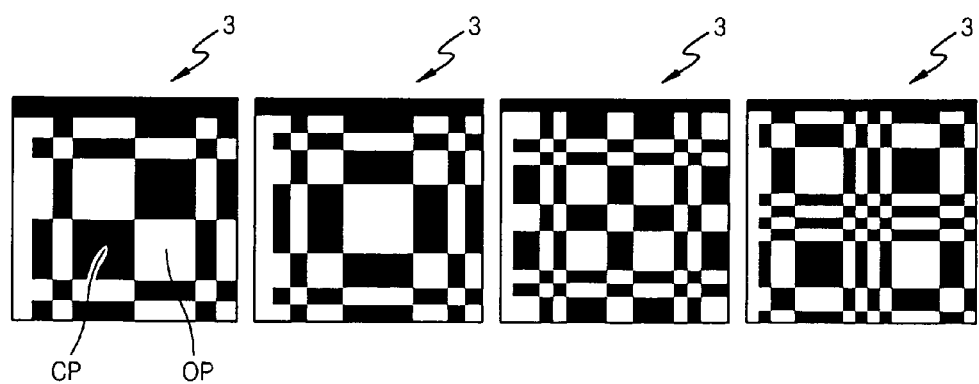
FIGS. 3A through 3D illustrates various optical pattern units according to an embodiment.

FIG. 3A shows the optical pattern unit 3 with respect to a group of 11×11 pixels in total. FIG. 3B shows the optical pattern unit 3 with respect to a group of 13×13 pixels in total. FIG. 3C shows the optical pattern unit 3 with respect to a group of 17×17 pixels in total. FIG. 3D shows the optical pattern unit 3 with respect to a group of 19×19 pixels in total.

In FIG. 3, a black portion indicates a light-blocking pattern CP that blocks light entering the sensor unit 4, and a white portion indicates a transmittance pattern OP that does not block light entering the sensor unit 4.

According to the present embodiment, the two optical pattern units 3 of FIG. 3 are spaced apart from each other in the center of the panel 10. Shapes of the optical pattern units 3 are determined by a plurality of the transmittance patterns OP and the light-blocking patterns CP that cross each other. The optical pattern units 3 are previously coded mathematically in such a way that the optical pattern units 3 overlap with the sensor units 4. Shapes and functions of the coded optical patterns are well known.

Hereinafter, how the transmittance pattern OP and the light-blocking pattern CP of the optical pattern units 3 are implemented in the organic light-emitting display device 100 of FIG. 2 will now be described in detail.

Figure 4:
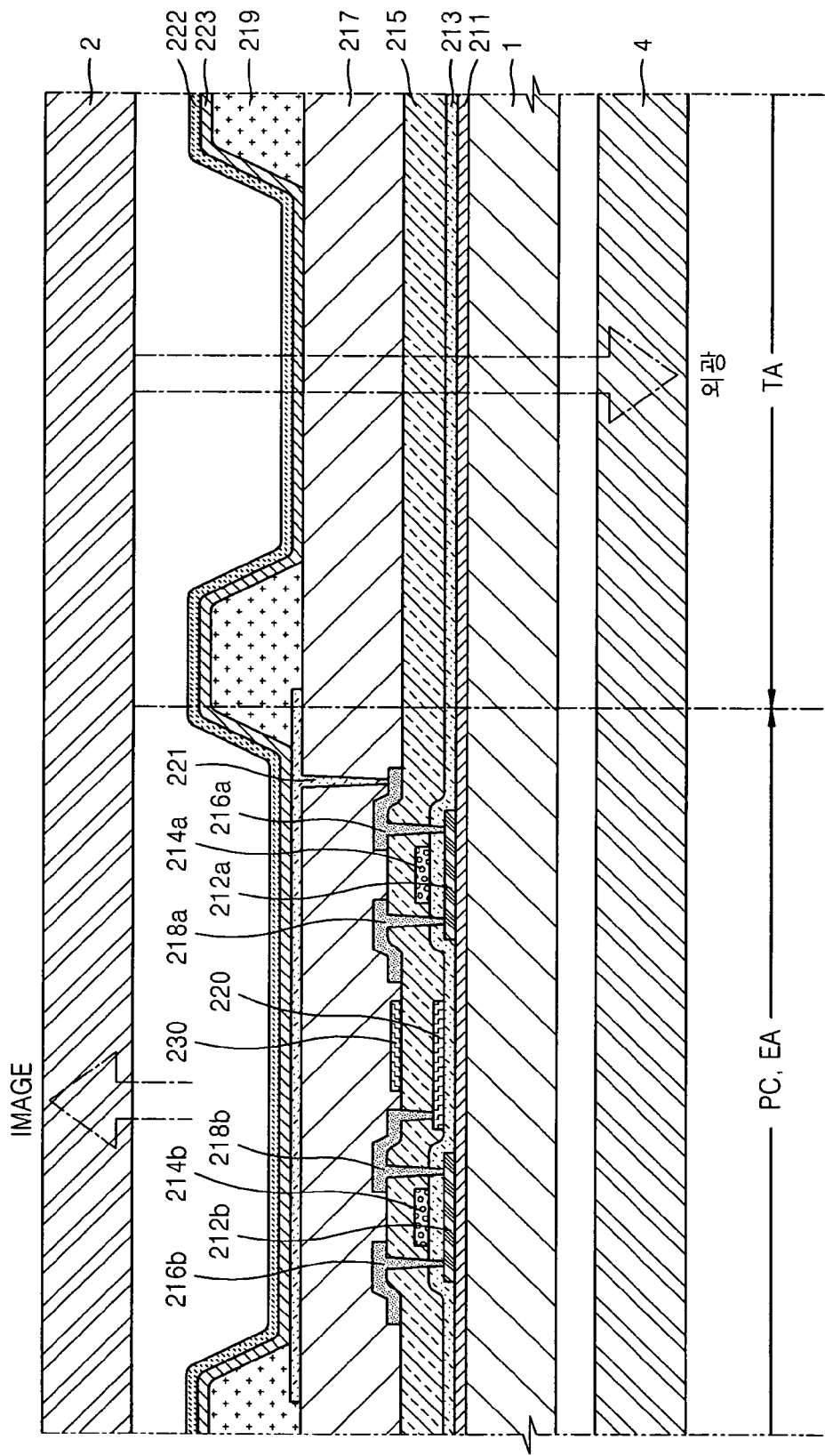
FIG. 4 is a schematic cross-sectional view of a transmittance pattern formed corresponding to a pixel included in the organic light emitting display apparatus of FIG. 2 according to an embodiment.
Figure 5:
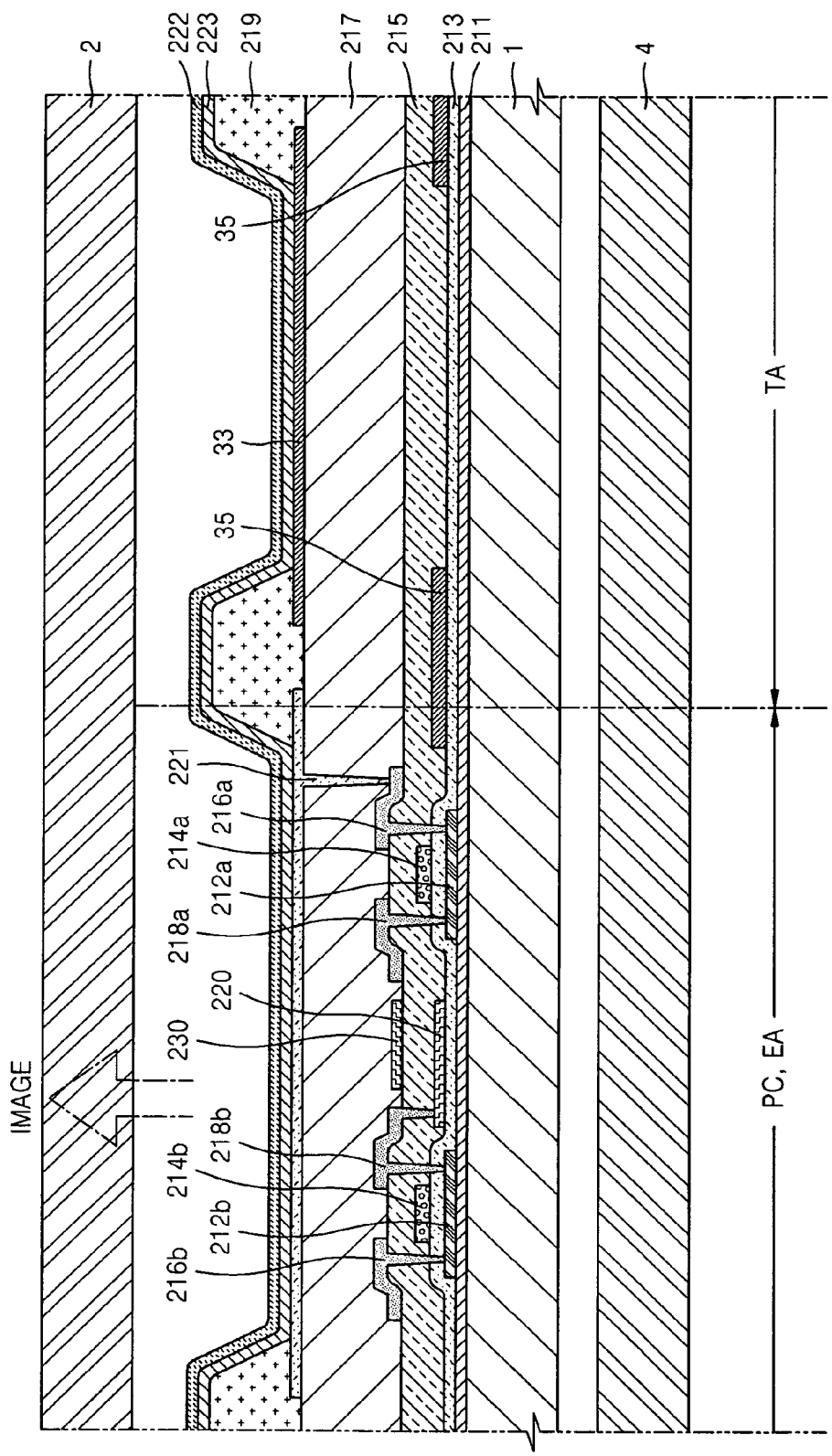
FIG. 5 is a schematic cross-sectional view of a light-blocking pattern formed corresponding to a pixel included in the organic light emitting display apparatus of FIG. 2 according to an embodiment.

FIG. 4 is a schematic cross-sectional view of the transmittance pattern OP formed corresponding to a pixel included in the organic light emitting display apparatus 100 of FIG. 2 according to an embodiment. FIG. 5 is a schematic cross-sectional view of the light-blocking pattern CP formed corresponding to a pixel included in the organic light emitting display apparatus 100 of FIG. 2 according to an embodiment.

Referring to FIGS. 4 and 5, the pixel area PA adjacent to the transmittance area TA in which external light transmits includes a light-emission unit EA emitting light, and the light-emission unit EA is electrically connected to the pixel circuit unit PC. The light-emission unit EA overlaps with the pixel circuit unit PC so as to cover the pixel circuit unit PC.

Referring to FIG. 4, the first and second TFTs TR1 and TR2 are formed on a first substrate 1 and have structures in which a buffer layer 211 is formed to prevent penetration of moisture. An active layer 212, a gate insulating layer 213, a gate electrode 214, an interlayer insulating layer 215, and source and drain electrodes 216 and 218 are sequentially formed on the buffer layer 211. A capacitor Cst is further formed on the gate insulating layer 213. Here, the capacitor Cst includes a lower electrode 220, an upper electrode 230, and an interlayer insulating 215 interposed between the lower electrode 220 and the upper electrode 230. The first and second TFTs TR1 and TR2, and the capacitor Cst are included in the pixel circuit unit PC.

The number of TFTs' and capacitors is not limited to the aforementioned number according to the present embodiment. According to the pixel circuit unit PC, two or more TFTs and one or more capacitors may be combined.

Next, a passivation layer 217 that is an insulating layer is formed to completely cover the pixel circuit unit PC and the transmittance area TA. Reference numeral 219 denotes a PDL.

A first electrode 221 that is electrically connected to the second TFT TR2 of the pixel circuit unit PC and that includes a reflective layer capable of reflecting light is formed on the passivation layer 217. Here, the first electrode 221 has a multi-layer structure of a transparent conductive layer and the reflective layer. Here, the transparent conductive layer may be formed of ITO, IZO, ZnO, or $In_2O_3$, which has a high work function. Here, the reflective layer may include at least one metal of Ag, Mg, Al, Pt, Pd, Au, Ni, Nd, Ir, Cr, Li, Ca, Mo, and alloys thereof. The first electrode 221 may be formed only in the light-emission unit EA. In this case, the first electrode 221 functions as an anode.

A second electrode 222 faces the first electrode 221 and is formed in the light-emission unit EA. The second electrode 222 is formed to be light-transmitting so as to emit light in a direction of the second electrode 222. For example, the second electrode 222 may be formed of metal having a small work function, e.g., Ag, Mg, Al, Pt, Pd, Au, Ni, Nd, Ir, Cr, Li, Ca, Yb, or alloys thereof. Here, the second electrode 222 may be formed as a thin film having a thickness in the range of 100 to 300 Å so as to have high transmittance. In this manner, the second electrode 222 is formed as a semi-transmissive and semi-reflective layer, so that the organic light-emitting display device 100 is formed as a top-emission organic light-emitting display device. In this case, the second electrode 222 functions as a cathode.

The second electrode 222 may be formed not only in the pixel area PA but also formed in the transmittance area TA. According to the present embodiment, the second electrode 222 is formed as the thin film, so that, although the second electrode 222 is formed in the transmittance area TA, external light may pass through the second electrode 222. Due to the first electrode 221 and the second electrode 222, in FIG. 10, light is emitted in a direction of the second electrode 222 that is a top surface direction.

An organic layer 223 is interposed between the first electrode 221 and the second electrode 222, and includes an EML. The organic layer 223 may be formed as a small-molecule organic layer or a polymer organic layer.

The second substrate 2 is formed to encapsulate the pixel area PA and the transmittance area TA formed on the first substrate 1. Here, the second substrate 2 may be formed of a transparent material, and may have a substrate shape or a sheet shape.

The sensor unit 4 is disposed near to the first substrate 1. In other words, the sensor unit 4 is disposed at a bottom side that is away from the occurrence of light emission.

Figure 10:
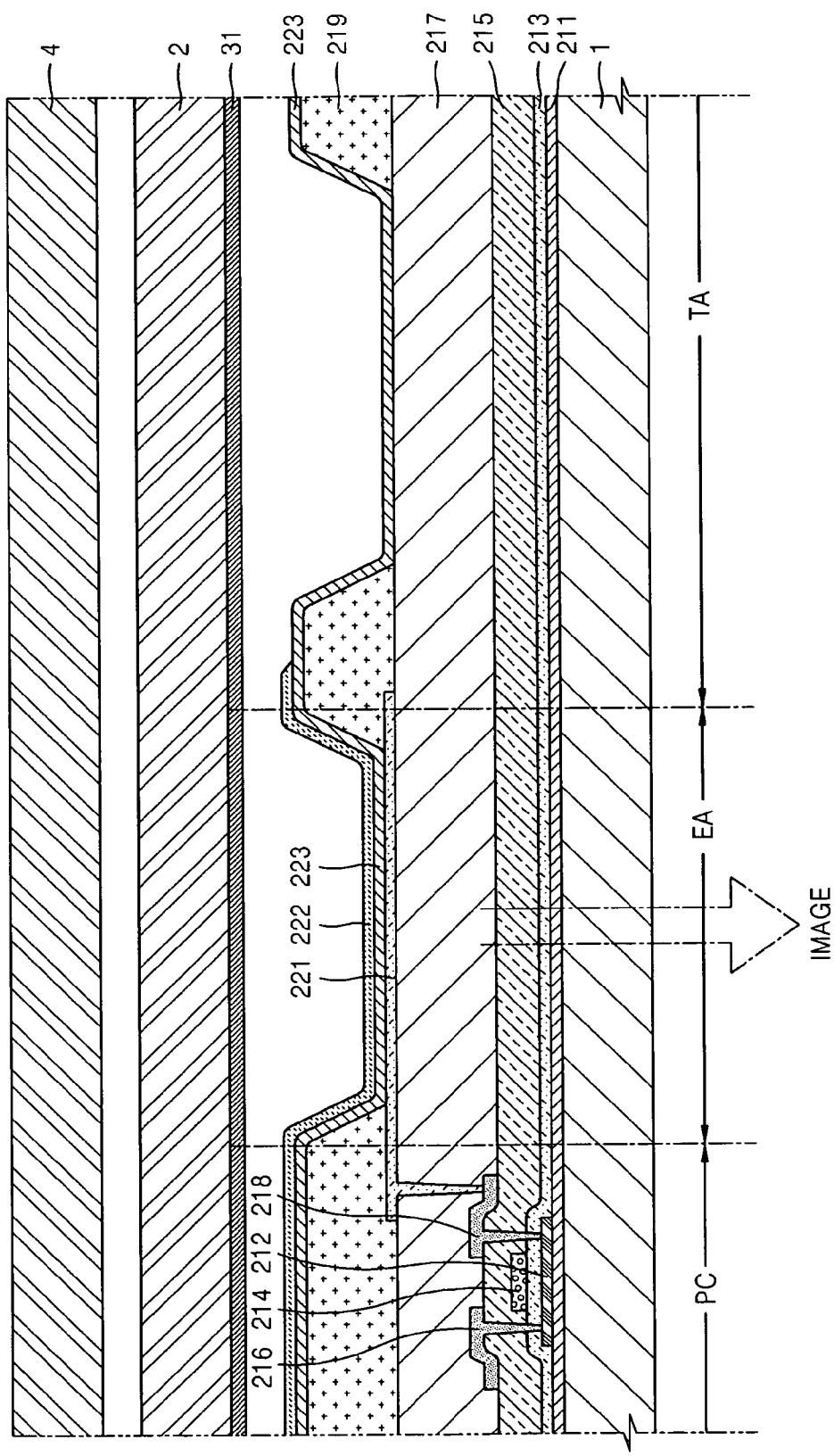
FIG. 10 is a cross-sectional view of an organic light emitting display apparatus taken along a line I-I' according to another embodiment.

Referring to the pixel PX of FIG. 10, in order to allow the sensor unit 4 corresponding to the transmittance area TA of the pixel to receive external light, a structure that blocks transmission of the external light is not formed in the transmittance area TA. In other words, the optical pattern unit 3 corresponding to the pixel of FIG. 4 corresponds to the transmittance pattern OP.

On the other hand, FIG. 5 illustrates a case in which the light-blocking pattern CP is formed to correspond to the transmittance area TA, according to another embodiment.

Unlike the case of FIG. 4, the case of FIG. 5 is characterized in that light-blocking layers 33 and 35 are formed on an insulating layer formed in the transmittance area TA. However, according to one or more embodiments, the light-blocking layers 33 and 35 may be formed on one surface of the first substrate 1 which corresponds to the transmittance area TA, or may be formed on the other surface of the first substrate 1. While it is sufficient for the light-blocking layers 33 and 35 to cover only the transmittance area TA, it is also possible for the light-blocking layers 33 and 35 to be formed in both of the pixel area PA and the transmittance area TA so as to completely cover the pixel.

In the organic light-emitting display device of FIG. 5, the first light-blocking layer 33 is formed on the passivation layer 217 corresponding to the transmittance area TA, and the second light-blocking layer 35 is formed on the gate insulating layer 213 corresponding to an area between the transmittance area TA and the pixel area PA. In other words, referring to FIG. 5, the light-blocking layer 33 formed on the same layer as the first electrode 221 cannot completely block external light escaping through a space between the first electrode 221 and the first light-blocking layer 33, and external light escaping through a space between the first light-blocking layer 33 and the first electrode 221 of an adjacent pixel. Thus, the second light-blocking layer 35 is further used.

The light-blocking layers 33 and 35 may be formed of a material capable of reflecting or blocking light, and for example, the light-blocking layer 31 may include at least one metal of Ag, Mg, Al, Pt, Pd, Au, Ni, Nd, Ir, Cr, Li, Ca, Mo, and alloys thereof or may include a black matrix material.

According to the present embodiment, the optical pattern unit 3 corresponding to the pixel of FIG. 5 includes the light-blocking layers 33 and 35 so that external light does not transmit by the transmittance area TA. Thus, the optical pattern unit 3 of FIG. 5 is the light-blocking pattern CP that cannot deliver light to the sensor unit 4 corresponding to the pixel.

Figure 6:
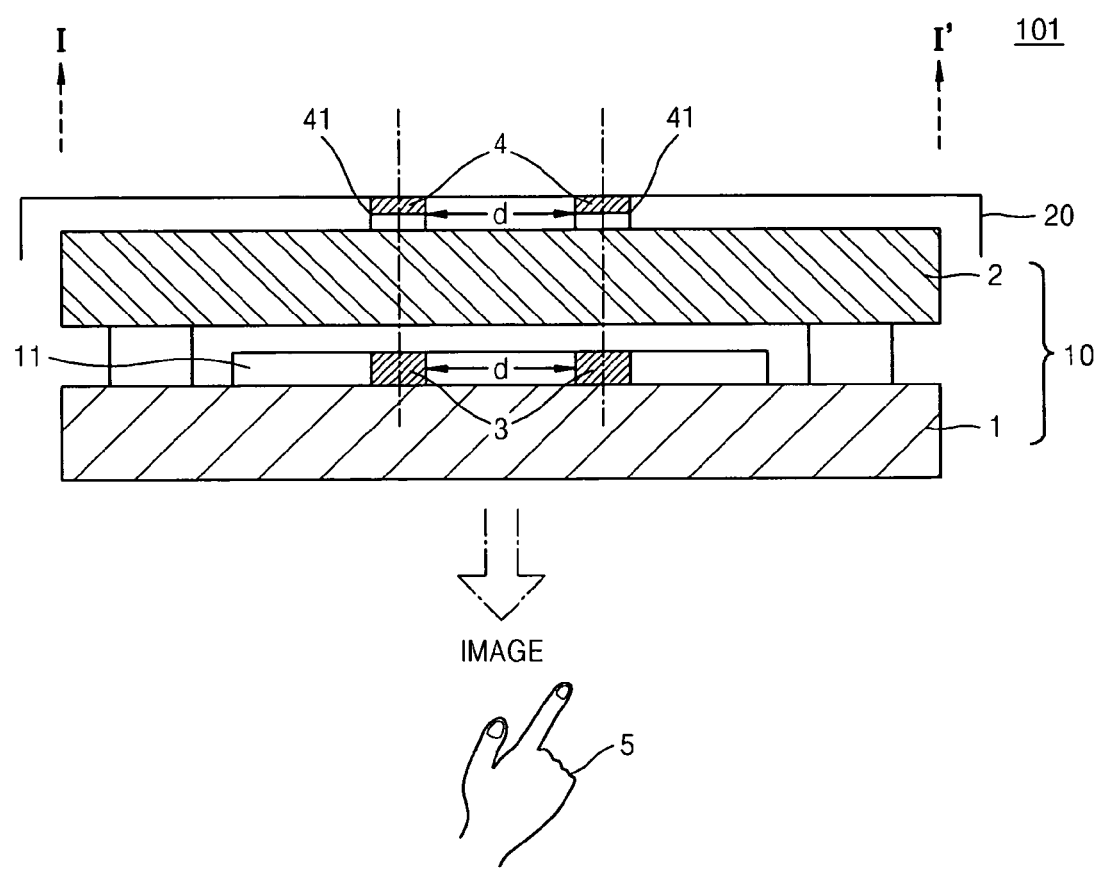
FIG. 6 is a cross-sectional view of an organic light emitting display apparatus taken along a line I-I' according to another embodiment.

FIG. 6 is a cross-sectional view of an organic light emitting display apparatus 101 taken along a line I-I' according to another embodiment.

Referring to FIG. 6, the organic light emitting display apparatus 101 is a bottom surface type organic light emitting display apparatus that forms an image in a direction of the first substrate 1. Thus, the sensor units 4 are formed outside of the second substrate 2.

Meanwhile, the organic light emitting display apparatus 101 may further include the case 20 that is formed in outside of the second substrate 2 and protects the second substrate 2. A circuit board may be disposed in the case 20. The sensor units 4 may be disposed in the case 20 when the case 20 is included in the organic light emitting display apparatus 101. According to the present embodiment, the sensor units 4 are disposed in the case 20. Thus, the organic light emitting display apparatus 101 may be manufactured with a minimum thickness.

Meanwhile, the occluder 41 may be further disposed between the case 20 and the second substrate 2. The occluder 41 is formed to surround boundaries of the sensor units 4. A hole (not shown) that functions as an air blowing hole may be formed in the case 20 to dissipate heat generated in the panel 10. However, external light is incident through the hole (not shown), which causes noise to occur in the sensor units 4. In this case, when the occluder 41 is formed to surround boundaries of the sensor units 4, the external light incident through the hole can be shaded, thereby preventing noise from occurring in the sensor units 4.

The panel 10 includes the pixel unit 11 as described above. The pixel unit 11 is formed on the first substrate 1, is partitioned as pixels each including the pixel area PA and the transmittance area TA, and includes two optical pattern units 3 corresponding to the pixels. The two sensor units 4 are disposed to correspond to the two optical pattern units 3. In this regard, a virtual first axis that passes through the center of the optical pattern units 3 is identical to a virtual second axis that passes through the center of the sensor units 4 corresponding to the optical pattern units 3. Thus, a small amount of information is lost through the optical pattern units 3 and the sensor units 4 when the user's gesture 5 is captured.

The optical pattern units 3 are formed in the center of the first substrate 1 so that the sensor units 4 are formed to correspond to the center of the first substrate 1, thereby reducing a dead zone generated when a conventional sensor or camera is disposed outside the panel 10.

Meanwhile, the two optical pattern units 3 are spaced apart from each other by the gap between the human's left and right eyes so that the two sensor units 4 are spaced apart from each other by the gap between the human's left and right eyes. According to the present embodiment, the user's gesture 5 is captured from the two sensor units 4 spaced by the gap between the human's left and right eyes, thereby obtaining 3D information.

Referring to FIGS. 1 and 6, the optical pattern units 3 form coded patterns by occluding or not occluding the predetermined transmittance area TA. The light-blocking pattern CP is a pattern to occlude the predetermined transmittance area TA. The transmittance pattern OP is a pattern that does not occlude the predetermined transmittance area TA.

According to the present embodiment, the light-blocking pattern CP and the transmittance pattern OP are implemented by using a structure of directly shading external light in the transparent organic light emitting display apparatus 101. Thus, no optical mask is used, thereby implementing a large-scale and slim display apparatus.

The transmittance pattern OP exhibits a similar effect to that of a pinhole lens. Light is wholly concentrated at one point of the pinhole lens and thus causing no aberration. A set of thick lenses including many lenses is usually necessary to remove aberrations, whereas the transmittance pattern OP causes no aberrations. Thus, the thickness of the transmittance pattern OP is greatly reduced.

Hereinafter, how the transmittance pattern OP and the light-blocking pattern CP of the optical pattern units 3 are implemented in the organic light-emitting display device 101 of FIG. 6 will now be described in detail.

Figure 7:
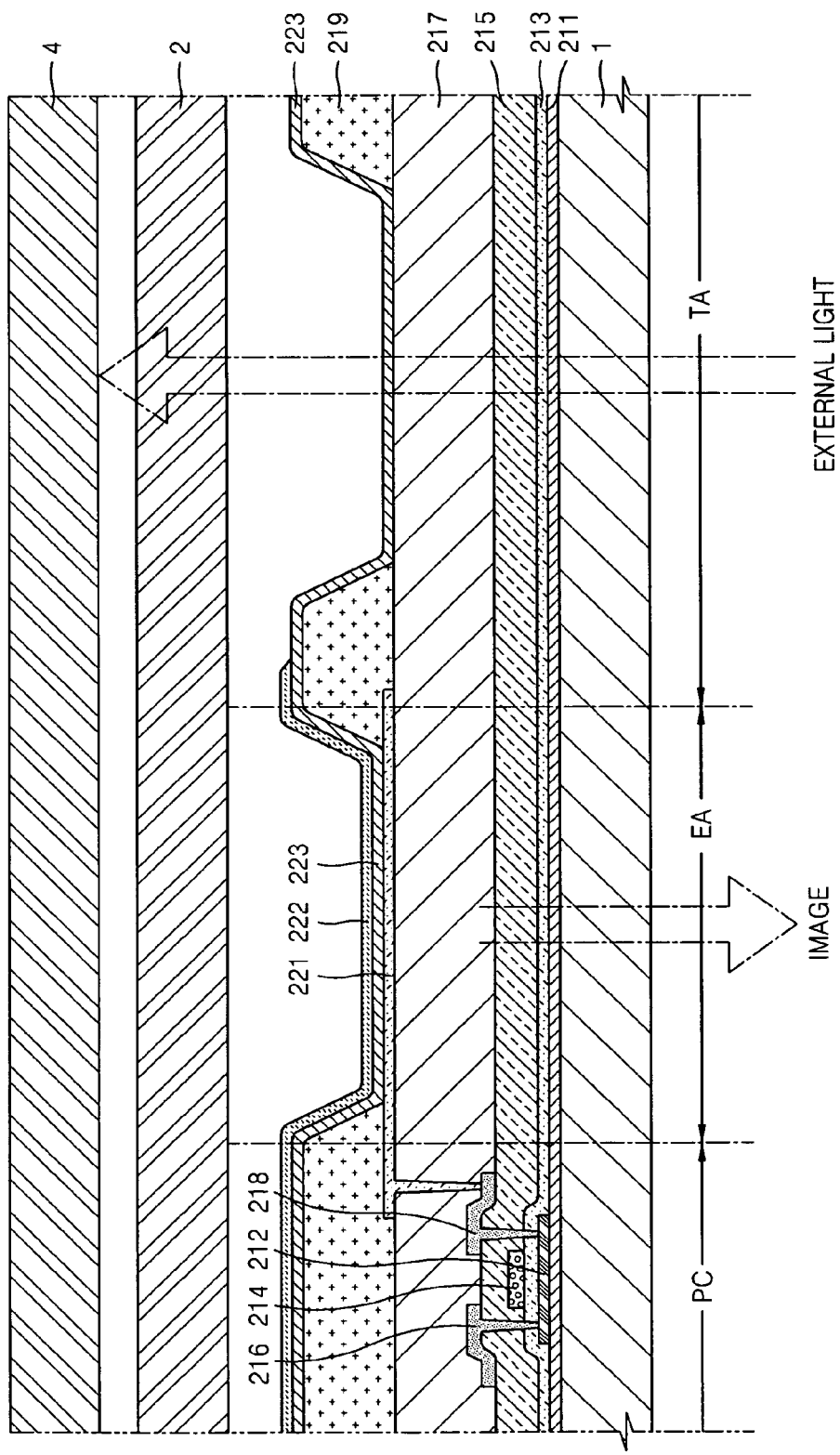
FIG. 7 is a schematic cross-sectional view of a transmittance pattern formed corresponding to a pixel included in the organic light emitting display apparatus of FIG. 2 according to another embodiment.
Figure 8:
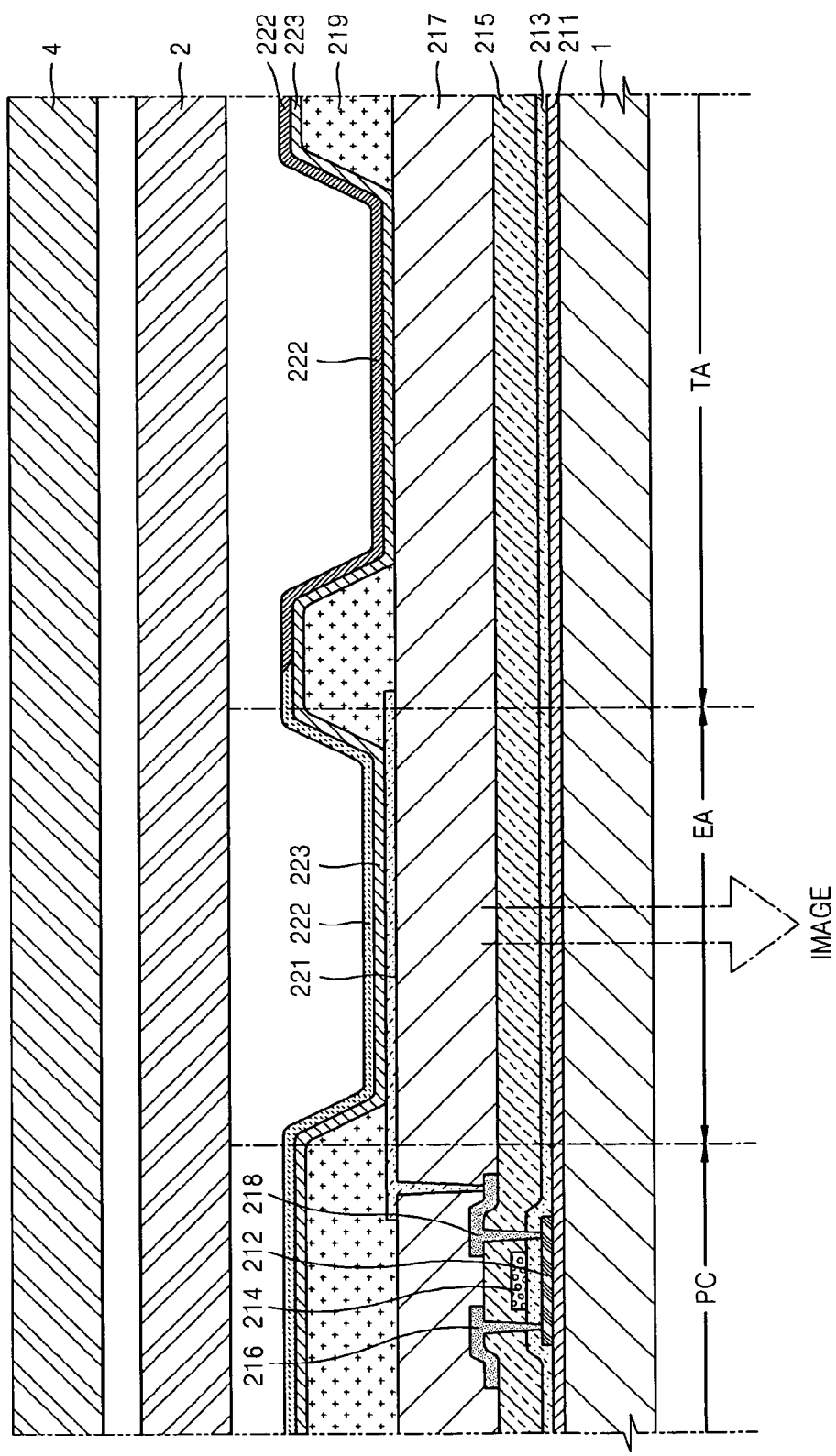
FIG. 8 is a schematic cross-sectional view of a light-blocking pattern formed corresponding to a pixel included in the organic light emitting display apparatus of FIG. 2 according to another embodiment.

FIG. 7 is a schematic cross-sectional view of the transmittance pattern OP formed corresponding to a pixel included in the organic light emitting display apparatus 101 of FIG. 6 according to an embodiment. FIG. 8 is a schematic cross-sectional view of the light-blocking pattern CP formed corresponding to a pixel included in the organic light emitting display apparatus 101 of FIG. 6 according to an embodiment.

Referring to FIGS. 7 and 8, the pixel area PA adjacent to the transmittance area TA, which transmits external light, includes the light-emission unit EA emitting light. The light-emission unit EA is electrically connected to the pixel circuit unit PC. The light-emission unit EA does not overlap with the pixel circuit unit PC but is adjacent thereto.

Referring to FIG. 7, the second TFT TR2 is formed on a first substrate 1 and has a structure in which a buffer layer 211 is formed to prevent penetration of moisture, and an active layer 212, a gate insulating layer 213, a gate electrode 214, an interlayer insulating layer 215, and source and drain electrodes 216 and 218 are sequentially formed on the buffer layer 211. The second TFT TR2 is included in the pixel circuit unit PC. Next, a passivation layer 217 that is an insulating layer is formed to completely cover the pixel circuit unit PC and the transmittance area TA. Reference numeral 219 denotes a pixel defining layer (PDL).

A first electrode 221 that is transparent and that is electrically connected to the second TFT TR2 of the pixel circuit unit PC is formed on the passivation layer 217. In particular, the first electrode 221 is included in the light-emission unit EA. Here, the first electrode 221 includes a transparent conductive material. For example, the first electrode 221 may be formed as ITO, IZO, ZnO, or $In_2O_3$, which has a high work function. In this case, the first electrode 221 functions as an anode.

A second electrode 222 faces the first electrode 221 and is formed in the light-emission unit EA. The second electrode 222 is formed of a material capable of reflecting light so as to emit the light toward the first electrode 221. For example, the second electrode 222 may include at least one metal of Ag, Mg, Al, Pt, Pd, Au, Ni, Nd, Ir, Cr, Li, Ca, Mo, and alloys thereof. In this case, the second electrode 222 functions as a cathode.

The second electrode 222 may extend over the entire pixel area PA so as to cover both of the light-emission unit EA and the pixel circuit unit PC. However, the second electrode 222 is not formed in the transmittance area TA. By doing so, external light may be transmitted to the sensor unit 4 via the transmittance area TA. Due to the first electrode 221 and the second electrode 222, in FIG. 7, light is emitted in a direction of the first electrode 221 that is a bottom surface direction.

An organic layer 223 is interposed between the first electrode 221 and the second electrode 222, and includes an emission layer (EML). The organic layer 223 may be formed as a small-molecule organic layer or a polymer organic layer.

The second substrate 2 is formed above the first substrate 1 so as to encapsulate the pixel area PA and the transmittance area TA. Here, the second substrate 2 may be formed of a transparent material, and may have a substrate shape or a sheet shape.

The sensor unit 4 is disposed near to the second substrate 2. In other words, the sensor unit 4 is disposed at a top side that is away from the occurrence of light emission.

Referring to the pixel of FIG. 7, in order to allow the sensor unit 4 corresponding to the transmittance area TA of the pixel to receive external light, a structure that blocks transmission of the external light is not formed in the transmittance area TA. In other words, the optical pattern unit 3 corresponding to the pixel of FIG. 7 corresponds to the transmittance pattern OP.

On the other hand, FIG. 8 illustrates a case in which the light-blocking pattern CP is formed to correspond to the transmittance area TA, according to another embodiment.

Unlike the embodiment of FIG. 7, the present embodiment of FIG. 8 is characterized in that the light-blocking layer 31 is not formed on a second substrate 2, but instead, a second electrode 222 capable of reflecting light extends over a transmittance area TA. In other words, as illustrated in FIG. 8, the second electrode 222 is formed to completely cover a pixel area PA and the transmittance area TA.

According to the present embodiment, the optical pattern unit 3 that corresponds to the pixel of FIG. 8 cannot transmit external light to the sensor unit 4. Thus, the optical pattern unit 3 of FIG. 8 is the light-blocking pattern CP that cannot deliver light to the sensor unit 4 corresponding to the pixel.

Figure 9:
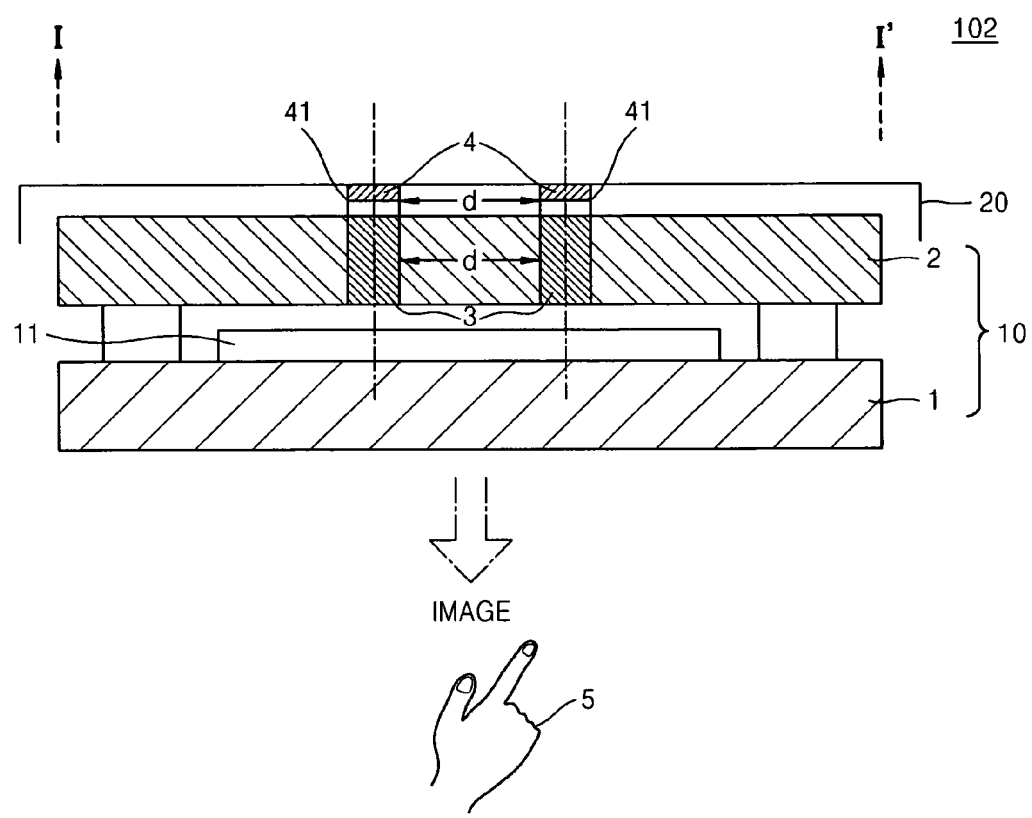
FIG. 9 is a cross-sectional view of an organic light emitting display apparatus taken along a line I-I' according to another embodiment.

FIG. 9 is a cross-sectional view of an organic light emitting display apparatus 102 taken along a line I-I' according to another embodiment.

The organic light emitting display apparatus 102 of FIG. 9 in which the optical pattern units 3 are not formed in the pixel unit 11 on the first substrate 1 and are directly formed on the second substrate 2 is different from the organic light emitting display apparatus 101 of FIG. 6. The other constituents of the organic light emitting display apparatus 102 are the same as or similar to the corresponding constituents of the embodiments described above, and thus detailed descriptions thereof will be omitted. The transmittance pattern OP of the organic light emitting display apparatus 102 of FIG. 9 is the same as that of the organic light emitting display apparatus 101 of FIG. 7. Thus, a detailed description thereof will be omitted.

FIG. 10 is a cross-sectional view of an organic light emitting display apparatus taken along a line I-I' according to another embodiment.

Referring to FIG. 10, the light-blocking layer 31 is formed on one surface of a second substrate 2. The light-blocking layer 31 is formed on the surface of the second substrate 2 facing a first substrate 1. However, according to one or more embodiments, the light-blocking layer 31 may be formed on the other surface of the second substrate 2 which is away from the first substrate 1. While it is sufficient for the light-blocking layer 31 to cover only the transmittance area TA, it is also possible for the light-blocking layer 31 to be formed in both of the pixel area PA and the transmittance area TA so as to completely cover the pixel.

The light-blocking layer 31 may be formed of a material capable of reflecting or blocking light, and for example, the light-blocking layer 31 may include at least one metal of Ag, Mg, Al, Pt, Pd, Au, Ni, Nd, Ir, Cr, Li, Ca, Mo, and alloys thereof or may include a black matrix material.

According to the present embodiment, the optical pattern unit 3 corresponding to the pixel of FIG. 10 includes the light-blocking layer 31 so that transmittance of external light is impossible via the transmittance area TA. Thus, the optical pattern unit 3 is the light-blocking pattern CP that cannot deliver light to the sensor unit 4 corresponding to the pixel.

Meanwhile, in the present embodiment, in order to further increase the transmittance of the transmittance area TA and to prevent optical interference due to transparent insulating layers in the transmittance area TA, and color purity deterioration and color change due to the optical interference, an opening may be formed in some of the insulating layers corresponding to the transmittance area TA.

For example, the opening may be formed in the PDL 219 corresponding to the transmittance area TA. However, the one or more embodiments are not limited thereto. Thus, openings connected to the opening of the PDL 219 may be further formed in one or more of the passivation layer 217, the interlayer insulating layer 215, the gate insulating layer 213, and the buffer layer 211, so that transmittance in the opening may be further increased.

By way of summation and review, a sensor or a camera may be installed outside of a display apparatus to capture a gesture. However, the sensor or the camera has a predetermined image angle, which may cause a dead zone. A dead zone is where a gesture in a center of the display apparatus cannot be captured.

In contrast, according to present embodiments, sensor units are disposed in a center unit of a transparent organic light emitting display apparatus, thereby removing the dead zone. In addition, coded optical pattern units are directly formed in a panel of the transparent organic light emitting display apparatus. Thus, an optical mask does not need to be attached thereto, allowing for slim and large-scale interactive media.

Exemplary embodiments have been disclosed herein, and although specific terms are employed, they are used and are to be interpreted in a generic and descriptive sense only and not for purpose of limitation.

What is claimed is:

1. An organic light-emitting display device, comprising:
a first substrate defined by a plurality of pixels each including a pixel area and a transmittance area adjacent to the pixel area, the pixel area emitting light in a first direction and the transmittance area transmitting external light;
a second substrate facing the first substrate and encapsulating the plurality of pixels on the first substrate;
a pair of sensor units corresponding to the pair of optical pattern units, the pair of sensor units being arranged in a second direction that is opposite to the first direction in which the light is emitted; and
a pair of optical pattern units for transmitting or blocking the external light for each transmittance area according to coded patterns corresponding to the plurality of pixels, the pair of optical pattern units being between a viewing surface of the organic light emitting display device and the pair of sensor units, the pair of sensor units receiving the external light passing through respective ones of the pair of optical pattern units.

2. The organic light-emitting display device as claimed in claim 1, wherein the pair of optical pattern units is spaced apart from each other by a gap between a human's left eye and the human's right eye.

3. The organic light-emitting display device as claimed in claim 1, wherein a virtual first axis that passes through a center of the pair of optical pattern units is identical to a virtual second axis that passes through a center of the pair of sensor units corresponding to the pair of optical pattern units.

4. The organic light-emitting display device as claimed in claim 1, wherein the pair of sensor units is a charge coupled device (CCD) sensor or a complementary metal semiconductor (CMOS) sensor.

5. The organic light-emitting display device as claimed in claim 1, further comprising:
- a pixel circuit unit on the first substrate, including one or more thin film transistors (TFTs), and positioned in the pixel area;
- an insulating layer covering the pixel area including the pixel circuit unit and the transmittance area;
- a first electrode on the insulating layer so as to be electrically connected to the pixel circuit unit, the first electrode being positioned in the pixel area and being adjacent to the pixel circuit unit so as not to overlap with the pixel circuit unit, and including a transparent conductive material;
- a second electrode capable of reflecting light so as to emit light toward the first electrode, the second electrode facing the first electrode and being positioned in the pixel area; and
- an organic layer between the first electrode and the second electrode and including an emission layer (EML).

6. The organic light-emitting display device as claimed in claim 5, wherein the second electrode includes at least one metal of Ag, Mg, Al, Pt, Pd, Au, Ni, Nd, Ir, Cr, Li, Ca, Mo, and alloys thereof.

7. The organic light-emitting display device as claimed in claim 5, wherein the pair of optical pattern units includes:
- a transmittance pattern through which the external light transmits; and
- a light-blocking pattern blocking the external light,
- wherein the light-blocking pattern is implemented when the second electrode capable of reflecting light is also formed in the transmittance area.

8. The organic light-emitting display device as claimed in claim 7, wherein the pair of sensor units is on side portions of the second substrate and receives the external light passing through the transmittance pattern of the optical pattern array.

9. The organic light-emitting display device as claimed in claim 7, further comprising a case formed outside of the second substrate and protecting the second substrate,
wherein the pair of sensor units is formed in the case and receives the external light passing through the transmittance pattern of the optical pattern array.

10. The organic light-emitting display device as claimed in claim 9, further comprising an occluder between the case and the second substrate, the occluder surrounds boundaries of the pair of sensor units.

11. The organic light-emitting display device as claimed in claim 1, further comprising:
- a pixel circuit unit on the first substrate, including one or more TFTs, and positioned in the pixel area;
- an insulating layer covering the pixel area including the pixel circuit unit and the transmittance area;
- a first electrode on the insulating layer so as to be electrically connected to the pixel circuit unit, the first electrode being positioned in the pixel area and overlapping with the pixel circuit unit so as to cover the pixel circuit unit, the first electrode including a reflective layer that is capable of reflecting light, and including a conductive material;
- a second electrode capable of transmitting light so as to emit light in an opposite direction to a direction in which the first electrode reflects light, the second electrode facing the first electrode; and
- an organic layer between the first electrode and the second electrode and including an EML.

12. The organic light-emitting display device as claimed in claim 11, wherein the pair of optical pattern units include:
- a transmittance pattern through which the external light transmits; and
- a light-blocking pattern blocking the external light,
- wherein the light-blocking pattern is implemented when a light-blocking layer capable of blocking light is on an insulating layer formed in the transmittance area.

13. The organic light-emitting display device as claimed in claim 12, wherein the light-blocking layer includes at least one metal of Ag, Mg, Al, Pt, Pd, Au, Ni, Nd, Ir, Cr, Li, Ca, Mo, and alloys thereof or includes a black matrix material.

14. The organic light-emitting display device as claimed in claim 12, wherein the pair of sensor units is on side portions of the first substrate and receives the external light passing through the transmittance pattern of the optical pattern array.

15. The organic light-emitting display device as claimed in claim 12, further comprising a case formed outside of the first substrate and protecting the first substrate,
wherein the pair of sensor units is formed in the case and receives the external light passing through the transmittance pattern of the optical pattern array.

16. The organic light-emitting display device as claimed in claim 15, further comprising an occluder between the case and the first substrate, and the occluder surrounds boundaries of the pair of sensor units.

17. The organic light-emitting display device as claimed in claim 1, wherein
the second substrate includes the pair of optical pattern units
wherein the pair of optical pattern units is formed in a center of the second substrate.

18. The organic light-emitting display device as claimed in claim 1, wherein the first substrate includes the pair of optical pattern units in a center thereof.

* * * * *